US009929227B2

(12) United States Patent
Sagawa

(10) Patent No.: US 9,929,227 B2
(45) Date of Patent: \*Mar. 27, 2018

(54) DISPLAY DEVICE

(71) Applicant: Sony Corporation, Tokyo (JP)

(72) Inventor: Hiroshi Sagawa, Kanagawa (JP)

(73) Assignee: Sony Corporation, Tokyo (JP)

( \* ) Notice: Subject to any disclaimer, the term of this patent is extended or adjusted under 35 U.S.C. 154(b) by 0 days.

This patent is subject to a terminal disclaimer.

(21) Appl. No.: 15/287,286

(22) Filed: Oct. 6, 2016

(65) Prior Publication Data

US 2017/0025490 A1 Jan. 26, 2017

Related U.S. Application Data

(63) Continuation of application No. 15/190,556, filed on Jun. 23, 2016, now Pat. No. 9,590,024, which is a continuation of application No. 14/512,028, filed on Oct. 10, 2014, now Pat. No. 9,401,321, which is a continuation of application No. 13/782,130, filed on
(Continued)

(30) Foreign Application Priority Data

Jun. 29, 2010 (JP) .................................. 2010-147859

(51) Int. Cl.
*H01L 27/32* (2006.01)
*H01L 51/52* (2006.01)
(Continued)

(52) U.S. Cl.
CPC .......... *H01L 27/3276* (2013.01); *H01L 23/50* (2013.01); *H01L 27/32* (2013.01);
(Continued)

(58) Field of Classification Search
CPC ... H01L 25/0753; H01L 27/153; H01L 33/62; H01L 33/20
See application file for complete search history.

(56) References Cited

U.S. PATENT DOCUMENTS 8,232,720 B2 7/2012 Matsuo et al.
8,399,892 B2 3/2013 Sagawa
(Continued)

FOREIGN PATENT DOCUMENTS

JP 2001-326362 11/2001
JP 2003-045668 2/2003
(Continued)

OTHER PUBLICATIONS

Japanese Office Action dated Jul. 24, 2014 in corresponding Japanese Application No. 2010-147859.

*Primary Examiner* — Quoc Hoang
(74) *Attorney, Agent, or Firm* — K&L Gates LLP

(57) ABSTRACT

A display device includes, on a substrate, light emitting elements each formed by sequentially stacking a first electrode layer, an organic layer including a light emission layer, and a second electrode layer and arranged in first and second directions which cross each other, a drive circuit including drive elements that drive light emitting elements, and a wiring extending in the first direction, and an insulating layer disposed in a gap region sandwiched by the light emitting elements neighboring in the second direction and having a recess or a projection. The wiring is disposed in an overlap region overlapping with the recess or the projection in the insulating layer in a thickness direction, in the gap region, and the second electrode layers in the light emitting elements neighboring in the second direction are separated from each other by the recess or the projection in the insulating layer.

22 Claims, 14 Drawing Sheets

Related U.S. Application Data

Mar. 1, 2013, now Pat. No. 8,866,133, which is a continuation of application No. 13/159,577, filed on Jun. 14, 2011, now Pat. No. 8,399,892.

(51) Int. Cl.
  *H01L 23/50* (2006.01)
  *H01L 27/12* (2006.01)

(52) U.S. Cl.
  CPC ...... *H01L 27/3246* (2013.01); *H01L 27/3258* (2013.01); *H01L 27/3262* (2013.01); *H01L 51/5203* (2013.01); *H01L 51/5228* (2013.01); *H01L 27/124* (2013.01); *H01L 27/1248* (2013.01); *H01L 2227/323* (2013.01); *H01L 2924/0002* (2013.01)

(56) References Cited

U.S. PATENT DOCUMENTS

| | | |
|---|---|---|
| 8,614,546 B2 | 12/2013 | Utsunomiya |
| 8,866,133 B2 | 10/2014 | Sagawa |
| 2006/0024855 A1 | 2/2006 | Sano |
| 2007/0228943 A1 | 10/2007 | Yamada et al. |
| 2012/0228603 A1 | 9/2012 | Nakamura |
| 2016/0307989 A1* | 10/2016 | Sagawa ............... H01L 27/3246 |

FOREIGN PATENT DOCUMENTS

| | | |
|---|---|---|
| JP | 2004-139970 | 5/2004 |
| JP | 2005-322564 | 11/2005 |
| WO | 2001-039554 | 5/2001 |

\* cited by examiner

▨ METAL LAYER OF FIRST HIERARCHY

☐ METAL LAYER OF SECOND HIERARCHY

▦ CONNECTION PART OF METAL LAYER OF FIRST HIERARCHY AND METAL LAYER OF SECOND HIERARCHY

▣ CONNECTION PART OF METAL LAYER OF SECOND HIERARCHY AND FIRST ELECTRODE LAYER

DISPLAY DEVICE

CROSS REFERENCES TO RELATED APPLICATIONS

The present application is a continuation of U.S. patent application Ser. No. 15/190,556, filed on Jun. 23, 2016, which application is a continuation of U.S. patent application Ser. No. 14/512,028, filed on Oct. 10, 2014, and issued as U.S. Pat. No. 9,401,321 on Jul. 26, 2016, which application is a continuation of U.S. patent application Ser. No. 13/782,130, filed on Mar. 1, 2013, and issued as U.S. Pat. No. 8,866,133 on Oct. 21, 2014, which application is a continuation of U.S. patent application Ser. No. 13/159,577 filed on Jun. 14, 2011, and issued as U.S. Pat. No. 8,399,892 on Mar. 19, 2013, which claims priority to Japanese Priority Patent Application JP 2010-147859 filed in the Japan Patent Office on Jun. 29, 2010, the entire content of which is hereby incorporated by reference.

BACKGROUND

The present application relates to a display device having a light emitting element of a self-emitting type including an organic layer.

In recent years, as a display device replacing a liquid crystal display, an organic EL display using an organic light emitting element of a self-emitting type including an organic layer is being practically used. Since the organic EL display is of a self-emitting type, the view angle is wider than that of liquid crystal or the like, and the organic EL display has sufficiently high response also to a high-definition high-speed video signal.

With respect to an organic light emitting element, an attempt for improving display performance was made by introducing a resonator structure and controlling light generated by a light emission layer by improving purity of light colors, increasing light emission efficiency, or the like (refer to, for example, WO 01/39554). For example, as illustrated in FIG. 14, an organic light emitting element Z10 of a top emission type that extracts light from a face (top surface) on the side opposite to a substrate employs a structure that an anode electrode Z13, an organic layer Z14, and a cathode electrode Z16 are sequentially stacked over the substrate via a drive transistor ZTr1. Light from the organic layer Z14 is multiple-reflected between the anode electrode Z13 and the cathode electrode Z16. The drive transistor ZTr1 drives the organic light emitting element Z10. A pixel drive circuit is constructed by the drive transistor ZTr1 together with a signal line Z120A and the like. In FIG. 14, Z111 denotes a substrate, Z212 indicates a gate insulating film of the drive transistor ZTr1, Z217 indicates a protection film made of silicon nitride or the like, and Z218 indicates a planarization film made of polyimide or the like. Further, Z17 denotes a metal layer as an auxiliary wiring, Z24 denotes an element isolation insulating layer, Z18 denotes a protection film made of silicon nitride or the like, and Z19 is a sealing substrate made of a transparent material.

SUMMARY

In a general organic EL display, from the viewpoint of assurance of simplicity of a configuration and manufacture easiness, the cathode electrode Z16 is formed so as to extend over an entire image display region. In other words, the cathode electrode Z16 is provided commonly to all of the organic light emitting elements Z10 disposed in a matrix in the image display region. Consequently, a part of the cathode electrode Z16 overlaps with the signal line Z120A in the thickness direction, and unnecessary parasite capacitance Cz is formed (refer to FIG. 14). Since the signal line Z120A is a path for supplying voltage of a video signal according to luminance information from an external signal supply source, even the unnecessary parasite capacitance Cz is formed, signal delay is caused. In some cases, it is difficult to display an accurate image corresponding to a video signal.

As a method of solving such a problem, there may be a method of increasing the distance in the thickness direction between the signal line Z120A and the cathode electrode Z16 (disposing them far from each other in the thickness direction). However, it disturbs compactification of the entire organic EL display, so that it is unrealistic.

It is therefore desirable to provide a display device capable of displaying more excellent image display performance even with a simple configuration.

A display device according to an embodiment of the application includes, on a substrate: a plurality of light emitting elements each formed by sequentially stacking a first electrode layer, an organic layer including a light emission layer, and a second electrode layer and arranged in first and second directions which cross each other; a drive circuit including a plurality of drive elements that drive the plurality of light emitting elements and a wiring extending in the first direction; and an insulating layer disposed in a gap region sandwiched by light emitting elements neighboring in the second direction and having a recess or a projection. The wiring is disposed in an overlap region overlapping the recess or the projection in the insulating layer in a thickness direction, in the gap region. The second electrode layers in the light emitting elements neighboring in the second direction are separated from each other by the recess or the projection in the insulating layer.

In the display device according to an embodiment of the application, the wiring included in the drive circuit that drives the light emitting elements is disposed in the overlap region overlapping the recess or the projection in the insulating layer in a thickness direction, in the gap region sandwiched by light emitting elements in the second direction. Moreover, the second electrode layers are separated from each other in the second direction by the recess or the projection in the insulating layer. Consequently, between a wiring and the first and second electrode layers constructing the light emitting element, formation of unnecessary parasite capacitance is avoided or the size of the parasite capacitance is sufficiently reduced. In addition, manufacture easiness at the time of manufacturing a display device having such a wiring and a second electrode layer is also assured.

In a display device as an embodiment of the application, the insulating layer having the recess or the projection is provided in the gap region between neighboring light emitting elements to separate the second electrode layers, and the wiring included in the drive circuit that drives the light emitting elements is disposed in the gap region. With the configuration, the facing portions between the wiring and the first and second electrode layers do not exist in the thickness direction, so that formation of unnecessary parasite capacitance is avoided, or the size of the parasite capacitance is sufficiently reduced. As a result, occurrence of unintended signal delay is suppressed, and accurate image display corresponding to a predetermined video signal is realized.

Additional features and advantages are described herein, and will be apparent from the following Detailed Description and the figures.

DETAILED DESCRIPTION

Embodiments of the present application will be described below in detail with reference to the drawings.

Modes for carrying out the present application (hereinbelow, called embodiments) will be described in detail below with reference to the drawings.

Figure 1:
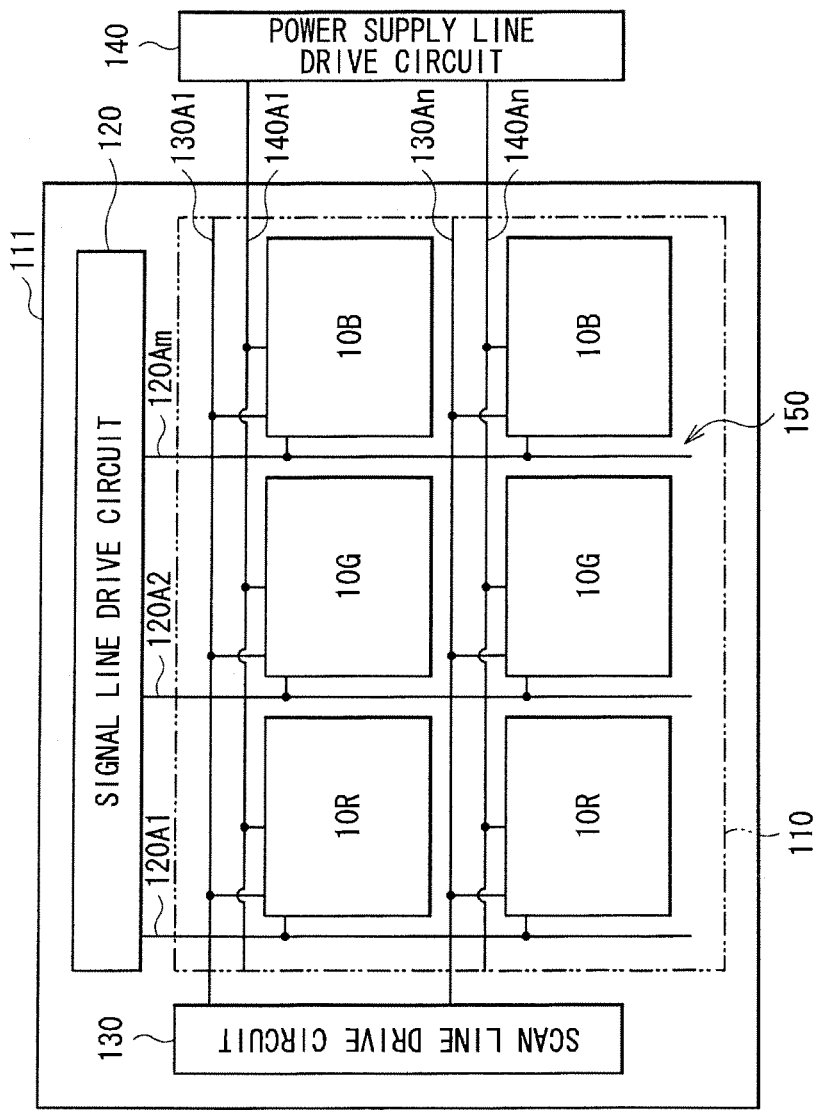
FIG. 1 is a diagram illustrating the configuration of a display device according to an embodiment.

FIG. 1 illustrates the configuration of a display device using an organic light emitting element according to an embodiment. A display device is used as an organic light emitting color display device of a very thin type or the like. In the display device, a display region 110 is formed on a substrate 111. In the periphery of the display region 110 on the substrate 111, for example, a signal line drive circuit 120, a scan line drive circuit 130, and a power supply line drive circuit 140 as drivers for displaying video images are formed.

In the display region 110, a plurality of organic light emitting elements 10 (10R, 10G, and 10B) disposed two-dimensionally in a matrix and a pixel drive circuit 150 for driving the elements are formed. In the pixel drive circuit 150, a plurality of signal lines 120A (120A1, 120A2, ..., 120Am, ...) are disposed in the column direction (Y direction) and a plurality of scan lines 130A (130A1, ..., 130An, ...) and a plurality of power supply lines 140A (140A1, ..., 140An, ...) are disposed in the row direction (X direction). Any one of the organic light emitting elements 10R, 10G, and 10B is provided at the intersecting point of each signal line 120A and each scan line 130A. The signal lines 120A are connected to the signal line drive circuit 120, the scan lines 130A are connected to the scan line drive circuit 130, and the power supply lines 140A are connected to the power supply line drive circuit 140.

The signal line drive circuit 120 supplies voltages of video signals according to luminance information supplied from a signal supply source (not shown) to the organic light emitting elements 10R, 10G, and 10B selected via the signal line 120A.

The scan line drive circuit 130 is constructed by a shift register for sequentially shifting (transferring) a start pulse in synchronization with an input clock pulse. The scan line drive circuit 130 scans the organic light emitting elements 10R, 10G, and 10B row by row at the time of writing video signals to the elements and sequentially supplies scan signals to the scan lines 130A.

The power supply line drive circuit 140 is constructed by a shift register or the like for sequentially shifting (transferring) a start pulse in synchronization with an input clock pulse. The power supply line drive circuit 140 properly supplies any of first and second potentials which are different from each other to the power supply lines 140A in synchronization with the scan on the row basis of the scan line drive circuit 130. By the operation, a conduction state or a non-conduction state of a drive transistor Tr1 which will be described later is selected.

Figure 2:
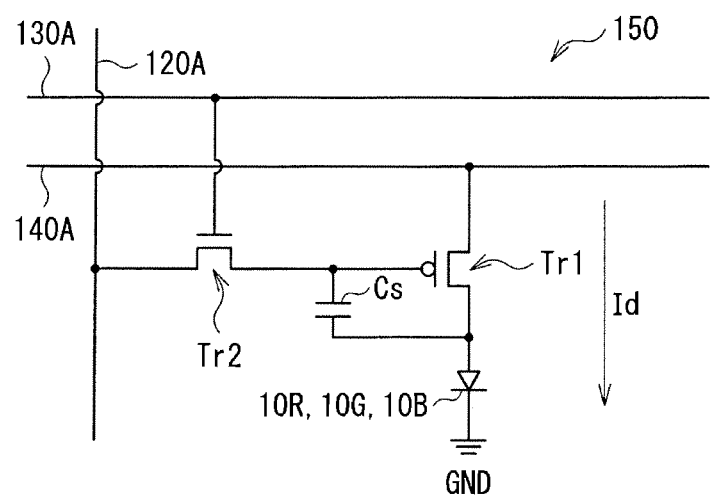
FIG. 2 is a diagram illustrating an example of a pixel drive circuit shown in FIG. 1.

The pixel drive circuit 150 is provided in a hierarchical layer (a pixel drive circuit formation layer 112 which will be described later) existing between the substrate 111 and the organic light emitting element 10. FIG. 2 illustrates a configuration example of the pixel drive circuit 150. As illustrated in FIG. 2, the pixel drive circuit 150 is an active-type drive circuit having the drive transistor Tr1, a write transistor Tr2, a capacitor (retention capacitor) Cs existing between the drive transistor Tr1 and the write transistor Tr2, and the organic light emitting element 10. The organic light emitting element 10 is connected in series to the drive transistor Tr1 between the power supply line 140A and a common power supply line (GND). Each of the drive transistor Tr1 and the write transistor Tr2 is a general thin film transistor (TFT) and may have, for example, an inverted-staggered structure (so-called bottom-gate type) or a staggered structure (top-gate type). The structure is not limited.

For example, the drain electrode of the write transistor Tr2 is connected to the signal line 120A, and a video signal is supplied from the signal line drive circuit 120 to the write transistor Tr2. The gate electrode of the write transistor Tr2 is connected to the scan line 130A, and a scan signal from the scan line drive circuit 130 is supplied to the write transistor Tr2. Further, the source electrode of the write transistor Tr2 is connected to the gate electrode of the drive transistor Tr1.

For example, the drain electrode of the drive transistor Tr1 is connected to the power supply line 140A, and the drive transistor Tr1 is set to either the first or second potential of the power supply line drive circuit 140. The source electrode of the drive transistor Tr1 is connected to the organic light emitting element 10.

The retention capacitor Cs is formed between the gate electrode of the drive transistor Tr1 (the source electrode of the write transistor Tr2) and the source electrode of the drive transistor Tr1.

Figure 3:
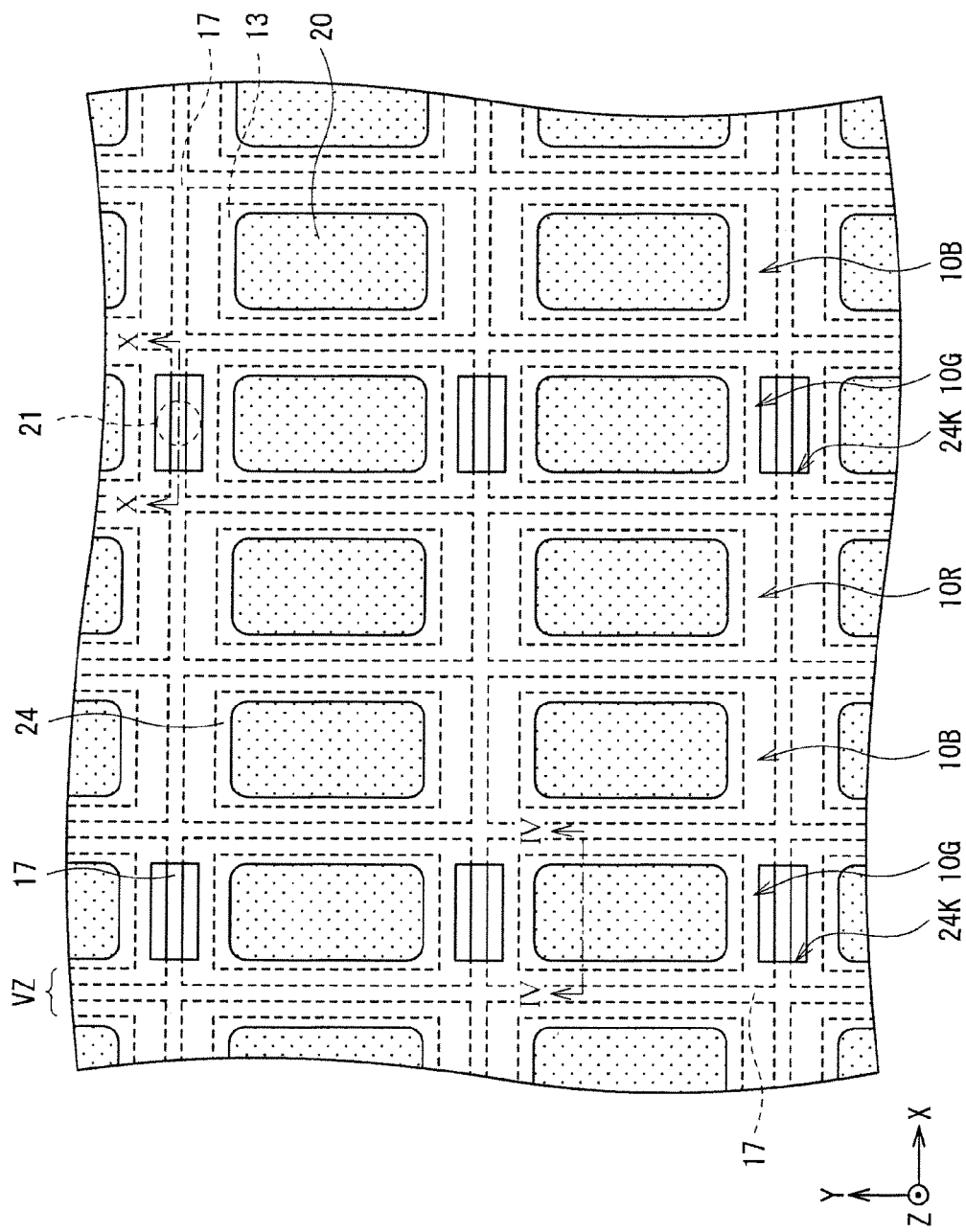
FIG. 3 is a plan view illustrating the configuration of a display region shown in FIG. 1.

FIG. 3 illustrates a configuration example of the display region 110 extending in an XY plane. It shows the planar configuration, as viewed from above, of the display region 110 in a state where a second electrode layer 16, a protection film 18, and a sealing substrate 19 (which will be described later) are removed. In the display region 110, the plurality of organic light emitting elements 10 are aligned in a matrix. More specifically, a metal layer 17 as an auxiliary wiring layer is provided in a lattice shape, and the organic light emitting elements 10R, 10G, and 10B are disposed one by one in regions defined by the metal layer 17. Each of the organic light emitting elements 10R, 10G, and 10B includes a light emitting region 20 whose outline is specified by an element isolation insulating layer 24. In FIG. 3, a broken-line rectangle surrounding the light emitting region 20 indicates a first electrode layer 13 (which will be described later) included in the organic light emitting element 10. The organic light emitting element 10R emits red light, the organic light emitting element 10G emits green light, and the organic light emitting element 10B emits blue light. The organic light emitting elements 10 emitting the same color are arranged in one line in the Y direction, and the organic light emitting elements 10 aligned by colors in the Y direction are repeatedly disposed in the X direction. Therefore, one pixel is constructed by a combination of the organic light emitting elements 10R, 10G, and 10B neighboring in the X direction.

In a plurality of gap regions VZ sandwiched by the organic light emitting elements 10 in the X direction, the signal lines 120A (not illustrated in FIG. 3) extending in the Y direction are provided. As illustrated in FIG. 3, in the element isolation insulating layer 24, some openings 24K are provided in a part of a region overlapping the metal layer 17 existing between organic light emitting elements neighboring in the Y direction. In the region surrounded by the openings 24K, a connection part 21 for achieving contact between the metal layer 17 and the second electrode layer 16 of the organic light emitting element 10 is constructed. The number of organic light emitting elements 10 arranged in the X and Y directions is set arbitrarily and is not limited to the number illustrated in FIG. 3. One pixel may be constructed by four or more organic light emitting elements, and organic light emitting elements that emit white light may be further provided.

Figure 4:
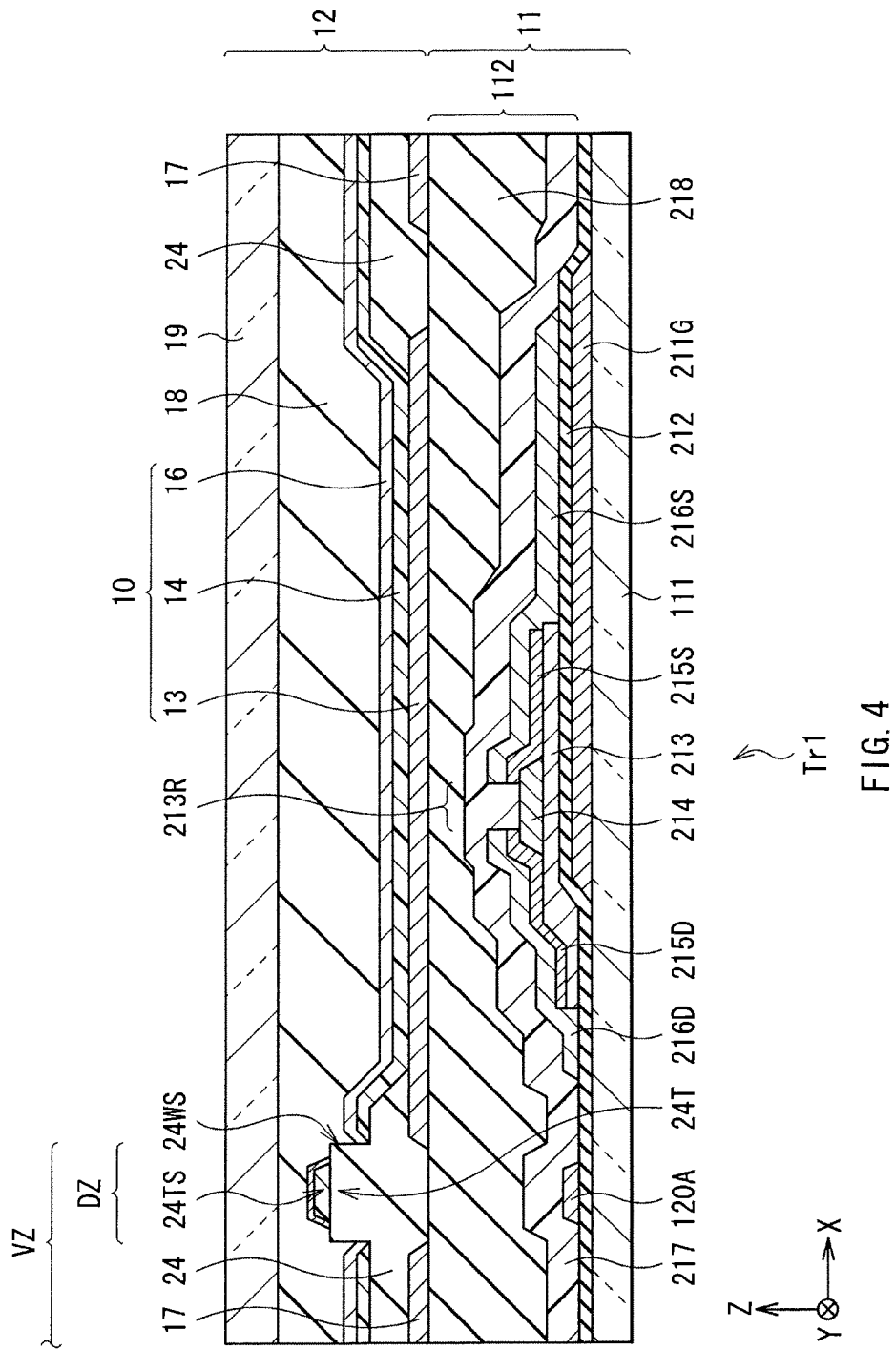
FIG. 4 is a cross section illustrating the configuration of the display region shown in FIG. 1.

FIG. 4 illustrates a schematic configuration in an XZ section taken along line IV-IV in FIG. 3, in the display region 110. As illustrated in FIG. 4, in the display region 110, a light emitting element formation layer 12 including the organic light emitting element 10 is formed on the substrate 11 in which the pixel drive circuit formation layer 112 is provided on the substrate 111. On the organic light emitting element 10, the protection film 18 and the sealing substrate 19 are provided in order. The organic light emitting element 10 is obtained by stacking, in order from the side of the substrate 111, the first electrode layer 13 as an anode electrode, an organic layer 14 including a light emission layer 14C (which will be described later), and the second electrode layer 16 as a cathode electrode. The organic layer 14 and the first electrode layer 13 of each organic light emitting element 10 are isolated by the element isolation insulating layer 24. On the other hand, the second electrode layer 16 is provided commonly to all of the organic light emitting elements 10. The metal layer 17 is buried by the element isolation insulating layer 24 except for the regions corresponding to the openings 24K.

The element isolation insulating layer 24 is provided so as to fill the gaps between the first electrode layer 13 and the organic layer 14 in the neighboring organic light emitting elements 10. The element isolation insulating layer 24 is made of an organic material such as polyimide, assures the insulation between the first electrode layer 13, and the second electrode layer 16 and the metal layer 17, and accurately defines the light emission region 20 in the organic light emitting element 10.

The protection film 18 covering the organic light emitting element 10 is made of an insulating material such as silicon nitride (SiNx). The sealing substrate 19 provided on the protection film 18 is to seal the organic light emitting element 10 together with the protection film 18, an adhesive layer (not illustrated) and the like, and is made of a material such as transparent glass transmitting light generated in the light emission layer 14C.

Figure 5:
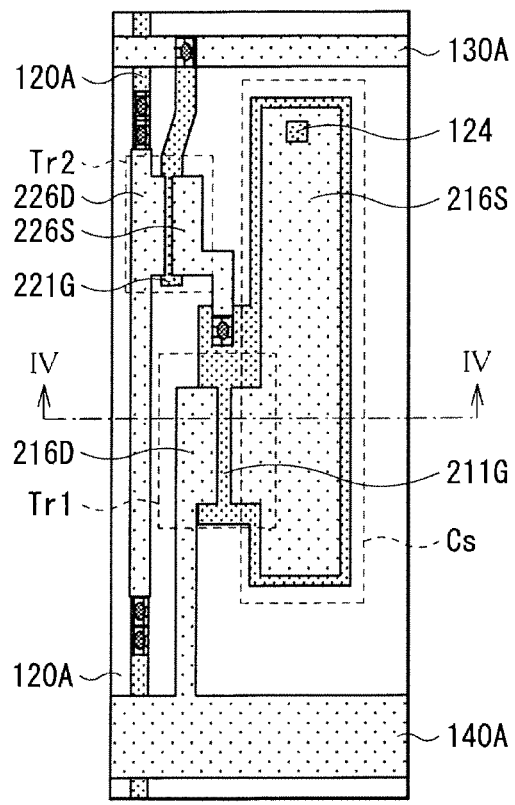
FIG. 5 is a plan view illustrating the configuration of a pixel drive circuit formation layer shown in FIG. 4.
Figure 6:
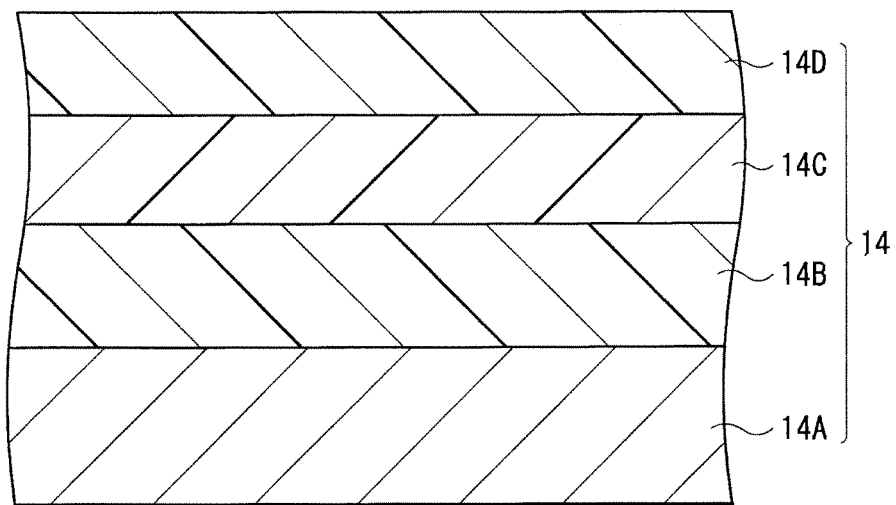
FIG. 6 is an enlarged cross section illustrating an organic layer shown in FIG. 5.

With reference to FIGS. 5 and 6 in addition to FIG. 4, the detailed configuration of the substrate 11 and the organic light emitting element 10 will be described. The organic light emitting elements 10R, 10G, and 10B have the common configurations except for a part of the configuration of the organic layer 14. In the following, the common configurations will be described.

FIG. 5 is a schematic view illustrating a planar configuration of the pixel drive circuit 150 provided for the pixel drive circuit formation layer 112, in one organic light emitting element 10. FIG. 4 corresponds to a section taken along line IV-IV illustrated in FIG. 5. FIG. 6 is a partly enlarged section of the organic layer 14 illustrated in FIG. 4.

The substrate 11 is obtained by providing the substrate 111 made by a glass or silicon (Si) wafer or made of resin or the like with the pixel drive circuit formation layer 112 including the pixel drive circuit 150. On the surface of the substrate 111, a metal layer 211G as the gate electrode of the drive transistor Tr1, a metal layer 221G as the gate electrode of the write transistor Tr2, and a part of the signal line 120A (FIG. 5) are provided as metal layers in the first hierarchical layer. The metal layers 211G and 221G and the signal line 120A are covered with a gate insulating film 212 made of silicon nitride, silicon oxide, or the like.

In the drive transistor Tr1, a channel layer 213 which is a semiconductor thin film made of amorphous silicon or the like is provided in a part of a region corresponding to the metal layer 211G. On the channel layer 213, an insulating channel protection film 214 is provided so as to occupy a channel region 213R as a center region. In regions on both sides of the channel protection film 214, a drain electrode 215D and a source electrode 215S made by an n-type semiconductor thin film made of n-type amorphous silicon or the like are provided. The drain electrode 215D and the source electrode 215S are isolated from each other by the channel protection film 214, and their end faces are apart from each other with the channel region 213R in between. Further, a metal layer 216D as a drain wire and a metal layer 216S as a source wire are provided as metal layers in a second hierarchical layer so as to cover the drain electrode 215D and the source electrode 215S. The metal layers 216D and 216S have, for example, a structure in which a titanium (Ti) layer, an aluminum (Al) layer, and a titanium layer are stacked in order. The write transistor Tr2 has a configuration similar to that of the drive transistor Tr1. In FIG. 5, the metal layer 221G as the metal layer in the first hierarchical layer and the metal layer 226D (drain wire) and the metal layer 226S (source wire) as metal layers in the second hierarchical layer are illustrated as components of the write transistor Tr2.

As the metal layers in the second hierarchical layer, the scan line 130A and the power supply line 140A are provided in addition to the metal layers 216D and 226D and the metal layers 216S and 226S. Although the drive transistor Tr1 and the write transistor Tr2 having the inverted-staggered structure (so-called bottom-gate type) have been described above, they may have the staggered structure (so-called top-gate type). The signal line 120A is provided as the metal layer of the second hierarchical layer in the region other than the crossing point of the scan line 130A and the power supply line 140A.

The pixel drive circuit 150 is entirely covered with a protection film (passivation film) 217 made of silicon nitride or the like, and an insulating planarization film 218 is provided on the protection film 217. Desirably, the surface of the planarization film 218 has extremely high flatness. The fine connection hole 124 is provided in a partial region in the planarization film 218 and the protection film 217 (refer to FIG. 5). Since the planarization film 218 is thicker particularly than the protection film 217, preferably, the planarization film 218 is made of a material having high pattern precision like an organic material such as polyimide. The connection hole 124 is filled with the first electrode layer 13 to make conduction to the metal layer 216S constructing the source line of the drive transistor Tr1.

The first electrode layer 13 formed on the planarization film 218 also has the function as a reflecting layer and is desirable to be made of a material having reflectance as high as possible in order to increase the light emission efficiency. For this purpose, the first electrode layer 13 is made of a high-reflectance material such as aluminum (Al) or aluminum neodymium (AlNd). Aluminum has low resistance to a developing solution used for a developing process performed at the time of forming the opening 24K in the element isolation insulating layer 24 and is corrosion-prone. On the other hand, AlNd has high resistance to a developing solution and is not corrosion-prone. Preferably, the first electrode layer 13 has a single-layer structure made of AlNd or a two-layer structure of "Al layer (lower layer)/AlNd layer (upper layer)" of an aluminum layer and AlNd. In particular, the two-layer structure of "Al layer (lower layer)/ AlNd layer (upper layer)" is preferable for a reason that resistance is lower than that of a single AlNd layer. The thickness of the first electrode layer 13 as a whole is, for example, 100 nm to 1,000 nm both inclusive. Another configuration is also possible such that the first electrode layer 13 has a two-layer structure, the upper layer (a layer which is in contact with the organic layer 14) is made of the above-described high-reflectance material, and the lower layer (a layer which is in contact with the planarization film 218) is made of a low-reflectance material such as molybdenum (Mo) or its compound (alloy). By providing a layer having high light absorption rate on the face which is in contact with the pixel drive circuit formation layer 112 in which the drive transistor Tr1 and the write transistor Tr2 are provided, unnecessary light such as outside light and light leaked from the organic light emitting element 10 can be absorbed. As described above, the first electrode layer 13 is formed so as to cover the surface of the planarization film 218 and fill the connection hole 124.

The organic layer 14 is densely formed on the entire light emitting region 20 defined by the element isolation insulating layer 24. For example, as illustrated in FIG. 6, the organic layer 14 has a configuration in which a hole injection layer 14A, a hole transport layer 14B, a light emission layer 14C, and an electron transport layer 14D are stacked in order from the side of the first electrode layer 13. The layers other than the light emission layer 14C may be provided as necessary.

The hole injection layer 14A is a buffer layer for increasing the hole injection efficiency and to prevent leakage. The hole transport layer 14B is provided to increase the efficiency of transporting holes to the light emission layer 14C. The light emission layer 14C is provided to generate light by recombination of electrons and holes by application of electric field. The electron transport layer 14D is provided to increase the efficiency of transporting electrons to the light emission layer 14C. An electron injection layer (not illustrated) made of LiF, $Li_2O$, or the like may be provided between the electron transport layer 14D and the second electrode layer 16.

The configuration of the organic layer 14 varies according to the light emission colors of the organic light emitting elements 10R, 10G, and 10B. The hole injection layer 14A in the organic light emitting element 10R has, for example, a thickness of 5 nm to 300 nm both inclusive and is made of 4,4',4"-tris(3-methylphenylamino) triphenylamine (m-MTDATA) or 4,4',4"-tris(2-naphthylphenylamino) triphenylamine (2-TNATA). The hole transport layer 14B in the organic light emitting element 10R has, for example, a thickness of 5 nm to 30 nm both inclusive and is made of bis[(N-naphthyl)-N-phenyl]benzidine (α-NPD). The light emission layer 14C in the organic light emitting element 10R has, for example, a thickness of 10 nm to 100 nm both inclusive and is made of a material obtained by mixing 40 volume % of 2,6-bis[4-[N-(4-methoxyphenyl)-N-phenyl]aminostyryl] naphthalene-1,5-dicarbonitrile (BSN-BCN) to 8-quinolinol aluminum complex ($Alq_3$). The electron transport layer 14D of the organic light emitting element 10R has, for example, a thickness of 5 nm to 300 nm both inclusive and is made of $Alq_3$.

The hole injection layer 14A of the organic light emitting element 10G has, for example, a thickness of 5 nm to 300 nm both inclusive and is made of m-MTDATA or 2-TNATA. The hole transport layer 14B of the organic light emitting element 10G has, for example, a thickness of 5 nm to 300 nm both inclusive and is made of α-NPD. The light emission layer 14C in the organic light emitting element 10G has, for example, a thickness of 10 nm to 100 nm both inclusive and is made of a material obtained by mixing 3 volume % of coumarin 6 to $Alq_3$. The electron transport layer 14D in the organic light emitting element 10G has, for example, a thickness of 5 nm to 300 nm both inclusive and is made of $Alq_3$.

The hole injection layer 14A in the organic light emitting element 10B has, for example, a thickness of 5 nm to 300 nm both inclusive and is made of m-MTDATA or 2-TNATA. The hole transport layer 14B in the organic light emitting element 10B has, for example, a thickness of 5 nm to 300 nm both inclusive and is made of α-NPD. The light emission layer 14C in the organic light emitting element 10B has, for example, a thickness of 10 nm to 100 nm both inclusive and is made of spiro 6Φ. The electron transport layer 14D in the organic light emitting element 10B has, for example, a thickness of 5 nm to 300 nm both inclusive and is made of $Alq_3$.

The second electrode layer 16 has, for example, a thickness of 5 nm to 50 nm both inclusive and is made of a single metal element or alloy of aluminum (Al), magnesium (Mg), calcium (Ca), sodium (Na), or the like. Among them, an alloy of magnesium and silver (MgAg alloy) or alloy of aluminum (Al) and lithium (Li) (AlLi alloy) is preferable. The second electrode layer 16 is provided, for example, commonly to all of the organic light emitting elements 10R, 10G, and 10B and is disposed so as to face the first electrode layer 13 of each of the organic light emitting elements 10R, 10G, and 10B. Further, the second electrode layer 16 is formed so as to cover not only the organic layer 14 but also the element isolation insulating layer 24.

As illustrated in FIG. 4, the element isolation insulating layer 24 has a projection 24T in a gap region VZ. The gap region VZ is, as described above, a region sandwiched by the organic light emitting elements 10 which are neighboring in the X direction as the arrangement direction of the organic light emitting elements 10 for emitting different color rays.

Figure 7:
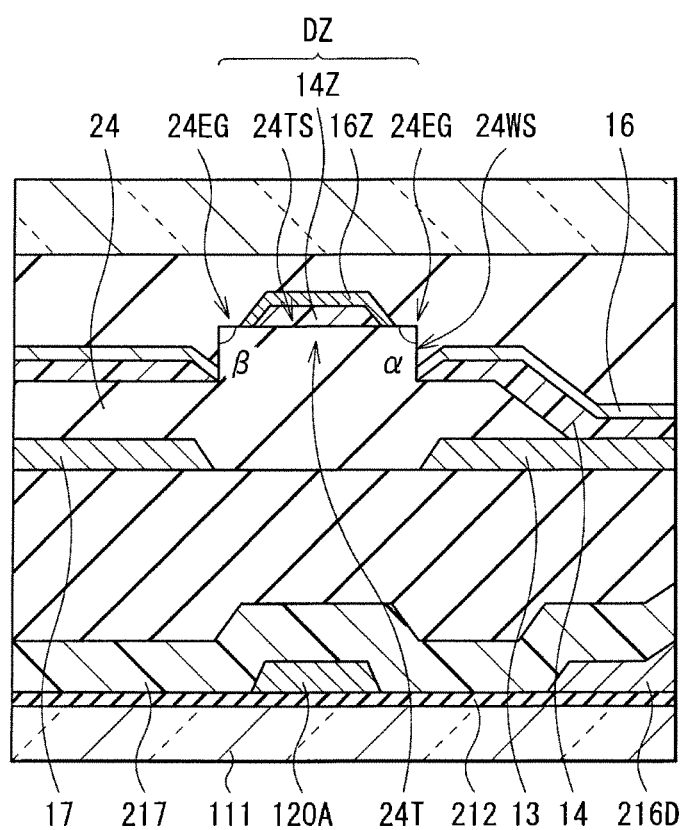
FIG. 7 is an enlarged cross section illustrating a configuration example of a projection in an element isolation insulating layer shown in FIG. 4.
Figure 8:
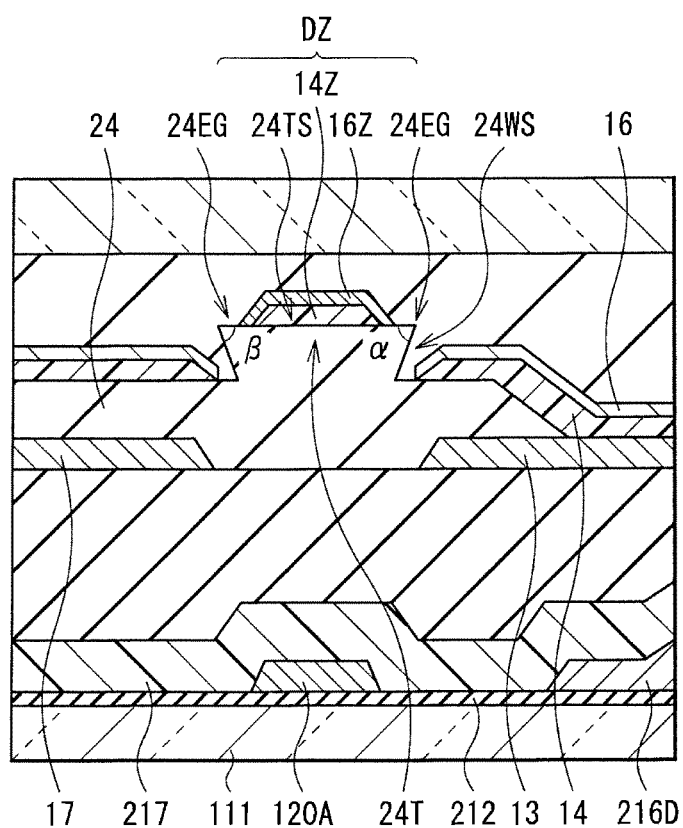
FIG. 8 is an enlarged cross section illustrating another configuration example of the projection in the element isolation insulating layer shown in FIG. 4.

FIG. 7 is an enlarged view of a portion around the projection 24T illustrated in FIG. 4. The signal line 120A is disposed in an overlap region DZ overlapping the projection 24T in the element isolation insulating layer 24 in the thickness direction (Z direction) in the gap region VZ. The second electrodes 16 in the organic light emitting elements 10 neighboring in the X direction are isolated from each other by the projection 24T in the element isolation insulating layer 24. One or both of angles α and β formed by a top surface 24TS and a side wall 24WS are 90° C. or less (preferably, less than 90° C.). Concretely, the projection 24T has, for example, a rectangular sectional shape as illustrated in FIG. 7 or an inverted trapezoidal shape as in another configuration example illustrated in FIG. 8. Due to the existence of the projection 24T, even in the case where the material of the second electrode layer 16 is deposited in a lump on the entire display region 110 by, for example, evaporation, the second electrode layers 16 in the neighboring organic light emitting elements 10 are naturally isolated from each other. Since each of the angles α and β at edges 24EG is 90° C. or less, a material to be deposited is not easily deposited in the region. As a result, the second electrode layer 16 provided in the light emission region 20 and a metal layer 16Z covering the top surface TS of the projection 24T are divided at the edge 24EG. In particular, when the projection 24T has an inverted-trapezoidal sectional shape as illustrated in FIG. 8, the second electrode layers 16 are divided from each other more reliably.

Figure 9:
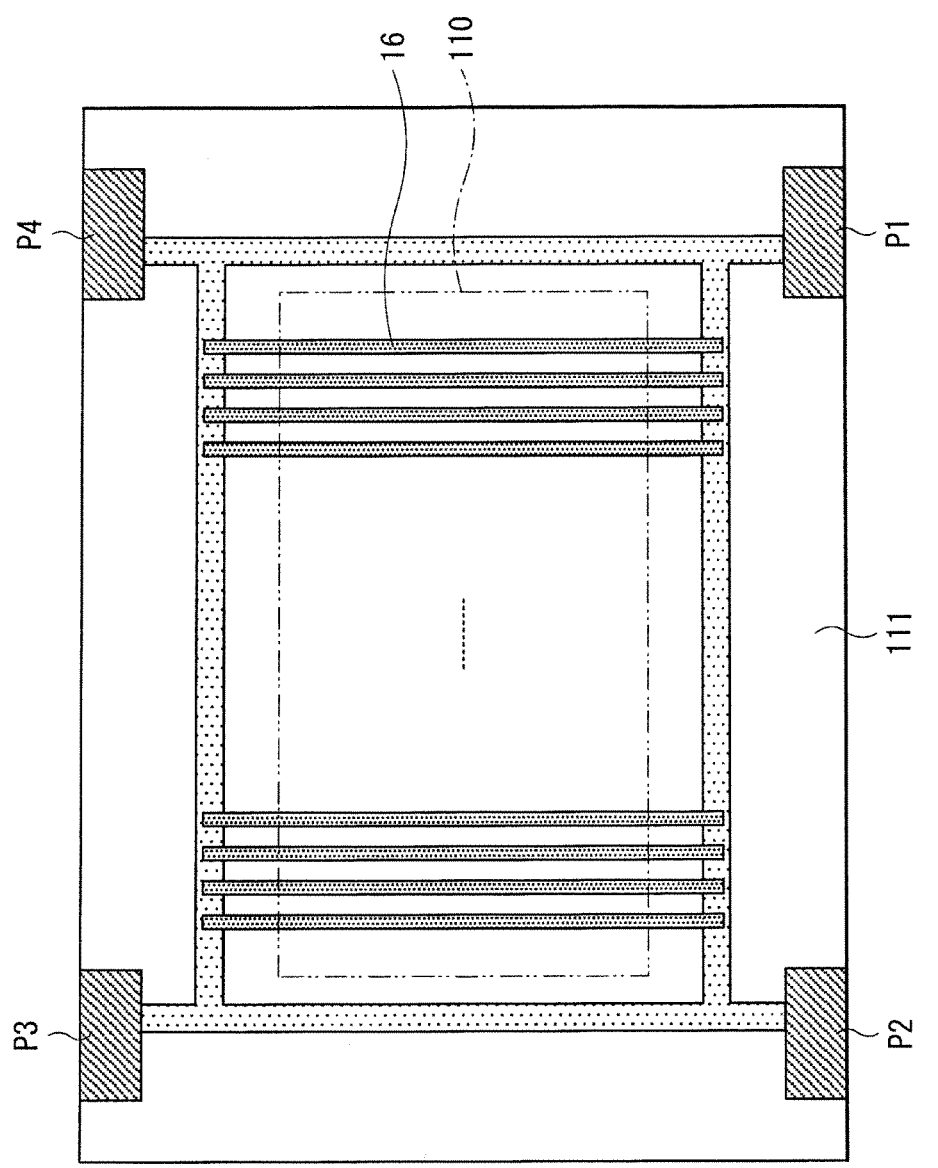
FIG. 9 is a schematic diagram illustrating a plane shape of a second electrode layer provided on a substrate of FIG. 1 and a wiring pattern in the periphery of the second electrode layer.

Since the second electrode layer 16 is divided in the overlap region DZ, its plane shape is a shape of rectangles whose longitudinal direction corresponds to the Y direction (refer to FIG. 9). FIG. 9 is a schematic diagram showing a plane shape of the second electrode layer 16 provided on the substrate 111 and wiring patterns in the periphery of the layer 16. As illustrated in FIG. 9, in the display device, a plurality of second electrode layers 16 extend in the Y direction so as to penetrate the display region 110 and are also arranged in the X direction. Further, both ends of each of the plurality of second electrode layers 16 are connected to a common wiring pattern and are connected to a common power supply line GND (refer to FIG. 2) via pads P1 to P4.

Figure 10:
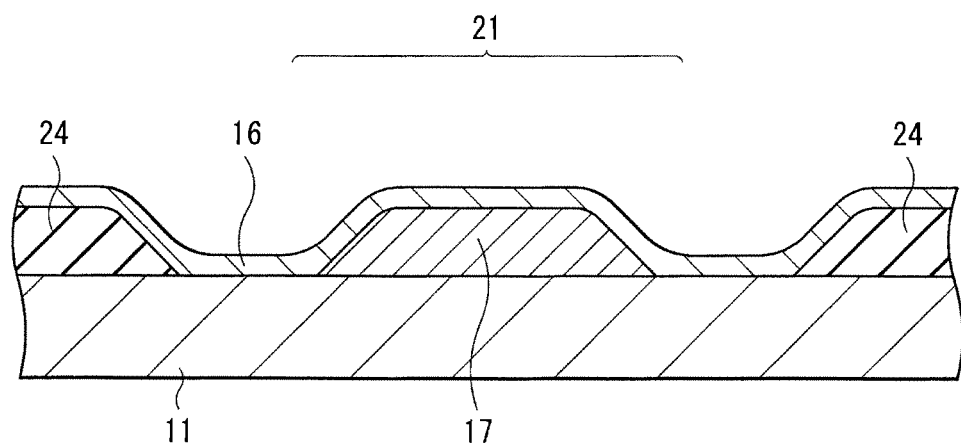
FIG. 10 is an enlarged cross section of a connection part illustrated in FIG. 3.

FIG. 10 is an enlarged section of a portion around the connection part 21 illustrated in FIG. 3. The metal layer 17 is formed on the surface of the planarization film 218 like in the first electrode layer 13 and functions as an auxiliary wiring which compensates a voltage drop in the second electrode layer 16 as a main electrode. As described above, the metal layer 17 is covered with the second electrode layer 16 in the connection part 21 in the region of the opening 24K and is electrically connected to the second electrode layer 16 (refer to FIG. 10). As illustrated in FIGS. 4, 7, and 8, the metal layer 17 in the gap region VZ is provided in a region other than the overlap region DZ in the gap region VZ and extends in parallel to the signal line 120A.

In the case where the metal layer 17 does not exist, the potential of the second electrode layer 16 connected to the common power supply line GND (refer to FIG. 2) varies between the organic light emitting elements 10R, 10G, and 10B due to voltage drops according to the distances from the power supply (not illustrated) to the organic light emitting elements 10R, 10G, and 10B, and conspicuous variations tend to occur. Such variations in the potential of the second electrode layer 16 cause luminance unevenness in the display region 110 and are not preferable. Even in the case where the screen of the display device is enlarged, the metal layer 17 functions to suppress the voltage drop from the power supply to the second electrode layer 16 to the minimum and suppress occurrence of such luminance unevenness.

For example, the display device is manufactured as follows. A method of manufacturing the display device of the embodiment will be described with reference to FIGS. 4 to 7.

First, on the substrate 111 made of the above-described material, the pixel drive circuit 150 including the drive transistor Tr1 and the write transistor Tr2 is formed. Concretely, first, a metal film is formed by, for example, sputtering on the substrate 111. After that, by patterning the metal film by, for example, photolithography, dry etching, or wet etching, the metal layers 211G and 221G and a part of the signal line 120A are formed on the substrate 111. Subsequently, the entire surface is covered with the gate insulating film 212. Further, on the gate insulating film 212, a channel layer, a channel protection film, a drain electrode and a source electrode, the metal layers 216D and 226D, and the metal layers 216S and 226S are formed in order in a predetermined shape. Together with the formation of the metal layers 216D and 226D and the metal layers 216S and 226S, a part of the signal line 120A, the scan line 130A, and the power supply line 140A are formed as the second metal layer. At this time, a connection part for connecting the metal layer 221G and the scan line 130A, a connection part for connecting the metal layer 226D and the signal line 120A, and a connection part for connecting the metal layers 226S and 211G are formed in advance. After that, by covering the whole with the protection film 217, the pixel drive circuit 150 is completed. An opening is formed by dry etching or the like, in a predetermined position on the metal layer 216S in the protection film 217.

After formation of the pixel drive circuit 150, a photosensitive resin whose main component is, for example, polyimide is coated on the entire surface by spin coating or the like. By performing the photolithography process on the photosensitive resin, the planarization film 218 having the connection hole 124 is formed. Concretely, for example, by selective exposure and development using a mask having an opening in a predetermined position, the connection hole 124 communicated with the opening provided in the protection film 217 is formed. After that, the planarization film 218 may be sintered as necessary to thereby obtain the pixel drive circuit formation layer 112.

Further, the first electrode layer 13 and the metal layer 17 made of the above-described predetermined material are formed. Concretely, the metal film made of the above-described material is formed on the entire surface by, for example sputtering and, after that, a resist pattern (not illustrated) in a predetermined shape is formed by using a predetermined mask on the stack film. Using the resist pattern as a mask, the metal film is selectively etched. The first electrode layer 13 is formed so as to cover the surface of the planarization film 218 and fill the connection hole 124. The metal layer 17 is formed on the surface of the planarization film 218 so as to surround the periphery of the first electrode layer 13 and so as not to overlap the signal line 120A. Preferably, the metal layer 17 is formed together with the first electrode layer 13 by using a material of the same kind as that of the first electrode layer 13.

After that, the element isolation insulating layer 24 is formed so as to fill the gap between the neighboring first electrode layers 13 and so as to cover the metal layer 17. In the operation, the opening 24K is formed in a predetermined position. Further, the projection 24T extending in the Y direction is formed in the overlap region DZ overlapping the signal line 120A. The projection 24T is formed by exposing process using, for example, a halftone mask or by performing multiple exposure process.

Subsequently, by sequentially stacking the hole injection layer 14A, the hole transport layer 14B, the light emission layer 14C, and the electron transport layer 14D each made of the above-described predetermined material and having the above-described thickness so as to completely cover the exposed part in the first electrode layer 13 by, for example, the evaporation method, the organic layer 14 is formed. Further, by forming the second electrode layer 16 on the entire surface so as to be opposed to the first electrode 13 with the organic layer 14 therebetween and so as to cover the metal layer 17 in the connection part 21, the organic light emitting element 10 is completed. In the formation, the thickness of the second electrode layer 16 is adjusted so as to be divided in the X direction by the edge 24EG of the projection 24T.

After that, the protection film 18 made of the above-described material is formed to cover the entire surface. Finally, an adhesive layer is formed on the protection film 18 and, using the adhesive layer, the sealing substrate 19 is adhered to the protection film 18. As a result, the display device is completed.

In the display device obtained in such a manner, a scan signal is supplied via the gate electrode (metal layer 221G) in the write transistor Tr2 from the scan line drive circuit 130 to each of the pixels, and an image signal from the signal line drive circuit 120 is retained in the retention capacitor Cs via the write transistor Tr2. On the other hand, the power supply line drive circuit 140 supplies a first potential higher than a second potential to each of the power supply lines 140A in synchronization with the scan on the row basis of the scan line drive circuit 130. As a result, the conduction state of the drive transistor Tr1 is selected and the drive current Id is injected to each of the organic light emitting elements 10R, 10G, and 10B, so that holes and electrons are recombined to generate light. The light is multiply-reflected between the first electrode layer 13 and the second electrode layer 16, passes through the second electrode layer 16, the protection film 18, and the sealing substrate 19, and is extracted.

As described above, in the embodiment, the second electrode layers 16 neighboring in the X direction are isolated from each other by the projection 24T in the element isolation insulating layer 24 in the gap region VZ. Moreover, the signal line 120A included in the pixel drive circuit 150 for driving the organic light emitting element 10 is disposed in the overlap region DZ overlapping the projection 24T in the thickness direction (Z direction) in the gap region VZ and extends in the Y direction. Consequently, an unnecessary parasitic capacitor is prevented from being formed between the signal line 120A and the first and second electrode layers 13 and 16 constructing the organic light emitting element 10 or the size of the parasitic capacitor is sufficiently reduced. As a result, occurrence of unintended signal delay is suppressed, and accurate image display corresponding to a predetermined video signal is realized.

In the embodiment, the plurality of second electrode layers 16 extending in the Y direction and arranged in the X direction are naturally formed by forming the projection 24T in the element isolation insulating layer 24 in advance and depositing the predetermined material so as to cover the entire display region 110. Therefore, without performing high-precision patterning process, the second electrode layer 16 is properly and easily disposed in a region which is not overlapped with the signal line 120A (the region other than the overlap region DZ).

There is another method of forming a plurality of the second electrode layer 16 having the shape of a plurality of rectangles by using a metal mask having slits. However, since the second electrode layer 16 is narrow in width (the limit slit width is about 20 μm), it is difficult to manufacture the metal mask itself corresponding to the width. Even if such a metal mask is manufactured, there is concern that the strength of the metal mask is insufficient. Further, the alignment precision of the metal mask is also limited. In contrast, in the embodiment, the projection 24T in the element isolation insulating layer 24 is formed by exposure or multiple exposure using, for example, a halftone mask. Consequently, high-precision position control is not demanded for formation of the projection 24T.

Figure 11:
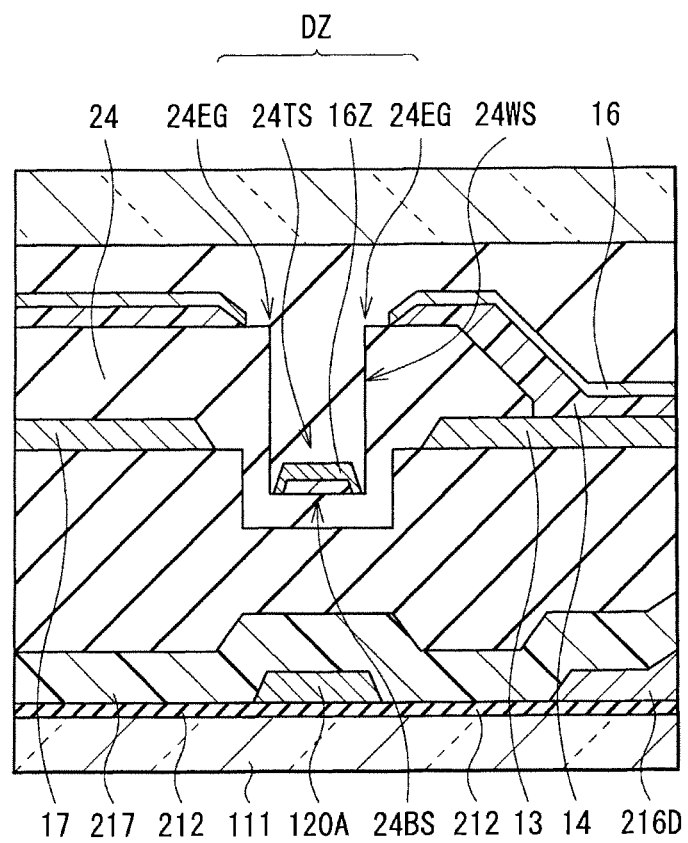
FIG. 11 is a cross section illustrating the configuration of a main part of a display device as a first modification.
Figure 12:
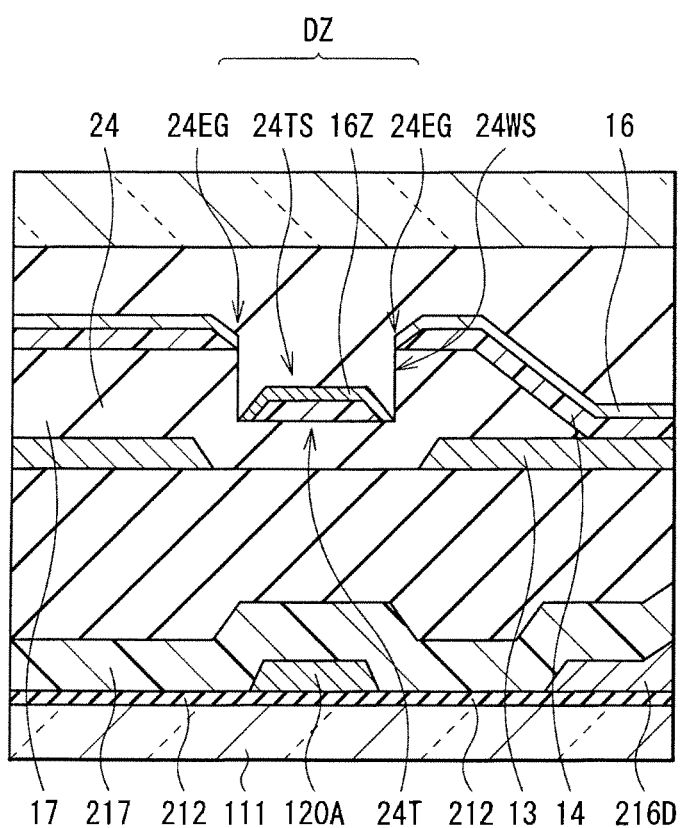
FIG. 12 is a cross section illustrating the configuration of a main part of a display device as a second modification.
Figure 13:
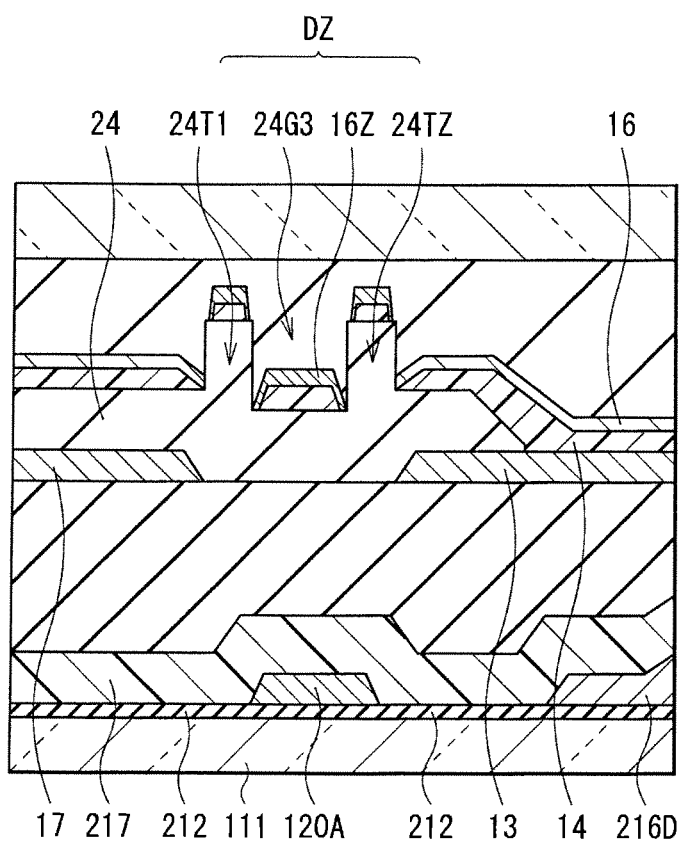
FIG. 13 is a cross section illustrating the configuration of a main part of a display device as a third modification.
Figure 14:
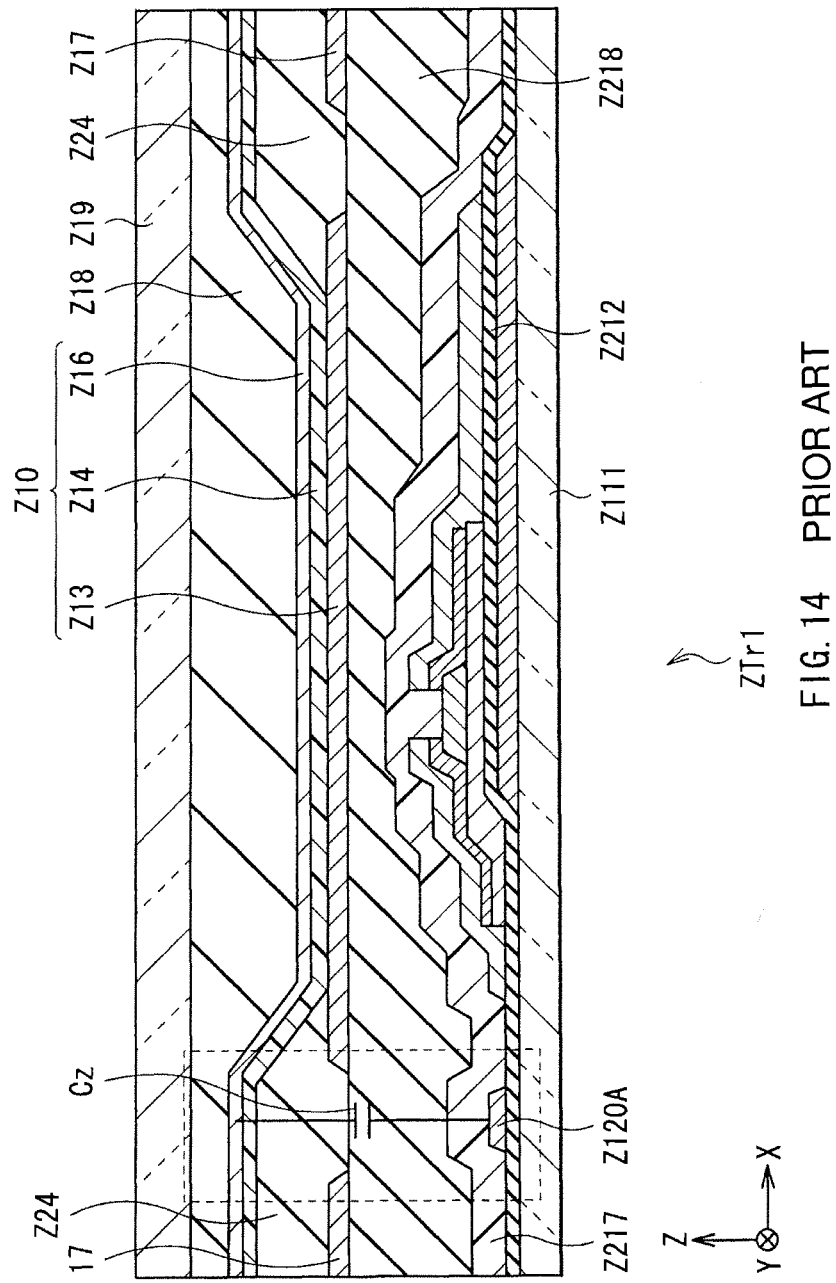
FIG. 14 is a cross section illustrating the configuration of a display device as a related art.

The present application has been described above by the embodiment, the application is not limited to the foregoing embodiment but may be variously modified. For example, in the foregoing embodiment, by providing the projection 24T in the overlap region DZ in the element isolation insulating layer 24, the neighboring second electrode layers 16 are isolated. However, the application is not limited to the embodiment. For example, as in first and second modifications of FIGS. 11 and 12, recesses 24G1 and 24G2 may be provided in the overlap region DZ. Alternatively, like in a third modification illustrated in FIG. 13, both of a recess 24G3 and projections 24T1 and 24T2 may be provided for the element isolation insulating layer 24 in the overlap region DZ. In any case, effects similar to those of the foregoing embodiment are obtained.

Although overlap between the signal line 120A extending in the arrangement direction (Y direction) of the organic light emitting elements 10 emitting the same color light and the second electrode layer 16 is avoided in the foregoing embodiment, the application is not limited to the case. For example, overlap between the scan line 130A and the power supply line 140A extending in the X direction and the second electrode layer 16 may be avoided. In this case, it is sufficient to form a recess or projection extending in the X direction in the overlap region overlapping the scan line 130A and the power supply line 140A in the element isolation insulating layer. By avoiding the overlap between the signal line 120A and the second electrode layer 16, the following technical advantages are obtained. Generally, in the case where the plurality of signal lines 120A are provided so as to overlap the common second electrode layer 16 (cathode electrode) in the thickness direction, variations often exist in the parasitic capacitance between the signal line 120A and the second electrode layer 16. In this case, parasite capacitances of different sizes (parasite capacitances between the signal line 120A and the second electrode layer 16) are adjacent to each other. Such variations in the parasite capacitances cause variations in the luminance in the organic light emitting elements 10. When the overlap between the signal line 120A and the second electrode layer 16 is avoided, occurrence of parasite capacitance between them is prevented. As a result, voltage applied to the signal line 120A is controlled, and accurate gradation expression is achieved.

The application is not limited to the materials of the layers, the stack order of the layers, the film forming methods, and the like described in the foregoing embodiment. For example, although the case where the first electrode layer 13 is used as an anode and the second electrode layer 16 is used as a cathode has been described in the foregoing embodiment, the first electrode layer 13 may be used as a cathode and the second electrode layer 16 may be used as an anode. Further, although the configuration of the organic light emitting elements 10R, 10G, and 10B has been described concretely in the foregoing embodiment, all of the layers do not have to be prepared, or other layers may be further provided. For example, a thin film layer for injecting holes made of chrome oxide (III) ($Cr_2O_3$), ITO (Indium-Tin Oxide, an oxide mixture film of indium (In) and tin (Sn)) may be provided between the first electrode layer 13 and the organic layer 14.

In addition, although the case where the second electrode layer 16 is constructed by a semipermeable reflection layer has been described in the foregoing embodiment, the second electrode layer 16 may have a structure in which a semipermeable reflection layer and a transparent electrode are stacked in order from the side of the first electrode layer 13. The transparent electrode is provided to decrease electric resistance of the semipermeable reflection layer and is made of a conductive material having sufficient translucency with respect to light generated by the light emission layer. A preferred material of the transparent electrode is, for example, a compound containing ITO or indium, zinc (Zn), and oxygen for a reason that excellent conduction is obtained even the film is formed at room temperature. The thickness of the transparent electrode is, for example, 30 nm to 1000 nm both inclusive. In this case, a resonator structure may be formed by using the semipermeable reflection layer as one end, providing the other end in a position opposed to the semipermeable electrode with the transparent electrode therebetween, and using the transparent electrode as a resonator. Further, when such a resonator structure is provided, the organic light emitting elements 10R, 10G, and 10B are covered with the protection film 18, and the protection film 18 is made of a material having a refractive index similar to that of the material of the transparent electrode, the protection film 18 serves as a part of the resonator and it is preferable.

In addition, although the case of the display device of the active matrix type has been described in the foregoing embodiments, the application is also applicable to a display device of a passive matrix type. Further, the configuration of the pixel drive circuit for active matrix driving is not limited to that described in the foregoing embodiments. As necessary, a capacitive element and a transistor may be added. In this case, according to a change in the pixel drive circuit, a necessary drive circuit may be provided in addition to the signal line drive circuit 120 and the scan line drive circuit 130.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A display device comprising:
    a substrate;
    a planarization film;
    a first light emitting element and a second light emitting element, each of the first and second light emitting elements including
        a first electrode formed on the planarization film,
        an organic light emission layer formed on the first electrode, and
        a second electrode formed on the organic light emission layer
    a scan line that propagates a scan signal, extending along a first direction and disposed on the substrate;
    a signal line that propagates an image signal, extending along a second direction that is perpendicular to the first direction and disposed on the substrate;
    a pixel circuit disposed on the substrate, the pixel circuit including a first transistor connected to the signal line and the scan line, and a second transistor that supplies a driving current to the first electrode, wherein the planarization film covers the scan line, the signal line and the pixel circuit;
    a metal layer formed on the planarization film; and
    an element isolation insulating layer formed on the planarization film and disposed between the first light emitting element and the second light emitting element;
    wherein the element isolation insulating layer has a base portion having a first upper surface and a projection portion having a second upper surface that is higher than the first surface, the projection portion being made of a same material as the base portion and formed in a region between the first and the second light emitting elements in a planer view,
    wherein the first and the second light emitting elements are adjacent each other along the first direction,
    wherein the organic light emission layer and the second electrode of the first light emitting elements cover the first upper surface, and
    wherein the metal layer is electrically connected to the second electrode of at least one of the first and the second light emitting elements, in a region other than light emitting regions of the first and the second light emitting elements.

2. The display device according to claim 1, wherein the projection portion has a sectional shape including two surfaces crossing each other at an acute angle.

3. The display device according to claim 1, wherein the projection is continuously formed as a portion of the element isolation insulating layer.

4. The display device according to claim 3, wherein the projection is made by exposing process using a halftone mask or by performing multiple exposure process.

5. The display device according to claim 1, wherein the first and the second upper surfaces are substantially parallel to a surface of the substrate on which the first and the second light emitting elements are formed.

6. The display device according to claim 1, wherein the metal layer is an auxiliary wiring for the second electrode and is disposed between the first and the second light emitting elements.

7. The display device according to claim 1, wherein the signal line extends though the region between the first and the second light emitting elements in the planer view.

8. The display device according to claim 7, wherein the pixel circuit is connected to one of the first or the second light emitting elements.

9. The display device according to claim 1, wherein the second electrode of each of the first and the second light emitting elements is formed as a common electrode layer.

10. The display device according to claim 1, wherein the common electrode layer is formed on the element isolation insulating layer.

11. The display device according to claim 10, wherein the common electrode layer has a discontinuity on the element isolation insulating layer.

12. The display device according to claim 1, wherein the element isolation insulating layer has a recess, and
a lowermost part of the recess has a third upper surface that is lower than those of the first and the second uppermost surfaces.

13. The display device according to claim 12, wherein a part of the organic light emission layer is disposed within the recess.

14. The display device according to claim 13, wherein the part of the organic light emission layer within the recess is divided from another part of the organic light emission layer.

15. The display device according to claim 1, wherein the signal lines overlaps with the projection portion in the planer view.

16. The display device according to claim 15, wherein a parasitic capacitance between the second electrode of the light emitting elements and the signal lines is reduced due to the projection portion.

17. A display device comprising:
a substrate;
a plurality of scanning lines extending along a first direction and disposed on the substrate;
a plurality of signal lines extending along a second direction that is perpendicular to the first direction and disposed on the substrate;
a plurality of pixel circuits disposed on the substrate;
a planarization film that covers the scanning lines, the signal lines and the pixel circuits;
a plurality of light emitting elements, wherein each of the light emitting elements includes:
a first electrode formed on the planarization film,
an organic light emission layer formed on the first electrode, and
a second electrode formed on the organic light emission layer, wherein light generated in the organic light emission layer is extracted through the second electrode;
a wiring formed on the planarization film, the wiring being electrically connected the second electrode of at least one of the light emitting elements in a region other than light emitting regions of the light emitting elements; and
an element isolation insulating layer formed on the planarization film,
wherein each of the pixel circuits includes:
a first transistor that samples an image signal; and
a second transistor that supplies a driving current to the first electrode of a corresponding one of the light emitting elements in response to the sampled image signal;
wherein the element isolation insulating layer includes a base portion having a first uppermost surface and a projection portion having a second uppermost surface that is higher than the first uppermost surface, the base portion and the projection portion being made of a same organic material,
the organic light emission layer of one of the first light emitting elements covers the first uppermost surface, and
the projection portion is protruding from the base portion in a thickness direction, and is located in a region between light emitting regions of two of the light emitting elements adjacent to each other along the first direction in a planar view.

18. The display device according to claim 17, wherein the second electrode of each of the light emitting elements is formed as a common layer.

19. The display device according to claim 18, wherein a first part of the common layer is disposed on the second uppermost surface.

20. The display device according to claim 19, wherein a second part of the common layer on the first uppermost surface is disposed at a first distance in the thickness direction from a surface of the substrate, and
the first part of the common layer on the second uppermost surface is at a second distance in the thickness direction from the surface of the substrate, the second distance being larger than the first distance.

21. The display device according to claim 20 wherein the element isolation insulating layer has a recess in the base portion,
a lowermost part of the recess has a third upper surface at the third distance from the surface of the substrate, and
wherein the first distance is smaller than the second distance, but is larger than the third distance.

22. The display device according to claim 21, wherein a part of the organic light emission layer and a third part of the common layer are disposed within the recess.

* * * * *